(12) United States Patent
Mori

(10) Patent No.: US 9,160,304 B2
(45) Date of Patent: Oct. 13, 2015

(54) BRANCHING FILTER AND COMMUNICATION MODULE COMPONENT

(75) Inventor: Yuuji Mori, Higashiomi (JP)

(73) Assignee: KYOCERA Corporation, Kyoto (JP)

( * ) Notice: Subject to any disclaimer, the term of this patent is extended or adjusted under 35 U.S.C. 154(b) by 177 days.

(21) Appl. No.: 13/982,829

(22) PCT Filed: Jan. 20, 2012

(86) PCT No.: PCT/JP2012/051211
§ 371 (c)(1),
(2), (4) Date: Jul. 31, 2013

(87) PCT Pub. No.: WO2012/105337
PCT Pub. Date: Aug. 9, 2012

(65) Prior Publication Data
US 2013/0307639 A1    Nov. 21, 2013

(30) Foreign Application Priority Data

Jan. 31, 2011  (JP) ................. 2011-018606

(51) Int. Cl.
*H03H 9/50* (2006.01)
*H03H 9/72* (2006.01)
*H03H 9/54* (2006.01)
(Continued)

(52) U.S. Cl.
CPC ............... *H03H 9/54* (2013.01); *H03H 9/0576* (2013.01); *H03H 9/725* (2013.01); *H03H 9/0057* (2013.01)

(58) Field of Classification Search
CPC ........... H03H 9/725; H03H 9/72; H03H 9/76; H03H 9/6483; H03H 9/64

USPC .......................................... 333/133, 193–196
See application file for complete search history.

(56) References Cited

U.S. PATENT DOCUMENTS 6,781,479 B2 *  8/2004  Ikada et al. ................... 333/133
7,149,494 B2 * 12/2006  Yamato ......................... 455/327
7,298,231 B2 * 11/2007  Ikuta et al. .................... 333/133
(Continued)

FOREIGN PATENT DOCUMENTS

JP      H05-183380 A      7/1993
JP      2007-258832 A    10/2007
(Continued)

OTHER PUBLICATIONS

Office Action dated Apr. 30, 2014, issued in counterpart Chinese application No. 201280000713.7.
(Continued)

*Primary Examiner* — Dean Takaoka
(74) *Attorney, Agent, or Firm* — Procopio, Cory, Hargreaves & Savitch LLP

(57) ABSTRACT

A branching filter has a group of terminals including an antenna terminal, a transmission signal terminal, reception signal terminals, and a ground terminal; a transmitting filter located between the antenna terminal and the transmission signal terminal; a second filter located between the antenna terminal and the reception signal terminals and; a first connection line connecting the parallel resonators and the ground terminal; a second connection line connecting the receiving filter and the ground terminal; and a third connection line which connects the first connection line and the second connection line and which is electromagnetically coupled with at least one of the resonators and lines configuring the transmitting filter.

9 Claims, 16 Drawing Sheets

(51) Int. Cl.
*H03H 9/05* (2006.01)
*H03H 9/00* (2006.01)

(56) References Cited

U.S. PATENT DOCUMENTS

| | | | |
|---|---|---|---|
| 8,902,020 B2* | 12/2014 | Bradley et al. | 333/133 |
| 2010/0007435 A1 | 1/2010 | Kawamoto et al. | |
| 2011/0193650 A1 | 8/2011 | Takenoshita et al. | |
| 2011/0193654 A1* | 8/2011 | Miyake | 333/186 |

FOREIGN PATENT DOCUMENTS

| | | |
|---|---|---|
| JP | 2009-290606 A | 12/2009 |
| JP | 2010-021718 A | 1/2010 |
| JP | 2011-10278 A | 1/2011 |

OTHER PUBLICATIONS

International Search Report dated Mar. 6, 2012, issued for International Application No. PCT/JP2012/051211.

* cited by examiner

BRANCHING FILTER AND COMMUNICATION MODULE COMPONENT

TECHNICAL FIELD

The present invention relates to a branching filter and a communication module component.

BACKGROUND ART

At a front end part of a communication terminal such as a mobile phone, use is made of a branching filter for branching transmission/reception frequencies.

A branching filter has an antenna terminal, transmitting terminal, and receiving terminal. A transmitting filter is arranged between the antenna terminal and the transmitting terminal, and a receiving filter is arranged between the antenna terminal and the receiving terminal. In the communication terminal, a transmitting circuit and a receiving circuit are arranged in a later stage of the branching filter. The branching filter has a function of branching the transmission signal from the transmitting circuit to the antenna terminal and branching the reception signal which was received at the antenna terminal to the receiving circuit.

In this type of a branching filter, in order to prevent the transmission signal from flowing to the receiving circuit or preventing the reception signal from flowing to the transmitting circuit, the transmitting filter and the receiving filter are matched.

However, depending on the design of the individual filters, even in a state where the best match is secured, for example, sometimes the impedance from the transmitting filter to the receiving filter becomes a bit lower than the impedance to the antenna and sometimes the impedance from the antenna to the transmitting filter becomes a bit lower than the impedance to the receiving filter. This being so, a signal which inherently should pass from the transmitting filter to the antenna flows to the receiving filter, a signal which should have been input from the antenna to the receiving filter flows to the transmitting filter, etc., so the isolation characteristics are degraded.

The transmitting filter and receiving filter which are used in the branching filter are configured by surface acoustic wave filters having IDT electrodes formed on piezoelectric substrates in many cases. In a conventional branching filter, the isolation characteristics have been improved by adjusting the impedances of the filters by changing the distance between electrode fingers of the IDT electrode or the number of electrode fingers or the like (see for example Patent Literature 1). In this regard, as the required specifications which are demanded from a branching filter, other than the isolation characteristics, attenuation characteristics become important as well. This is because, if either the isolation characteristics or attenuation characteristics are poor, the quality of communication of the mobile phone deteriorates or other problems occur.

With the conventional method of adjustment, however, the range of possible adjustment was limited. Therefore, it was difficult to satisfy both of the required specifications of the isolation characteristics and the attenuation characteristics.

The present invention was made in order to solve the above problems and provides a branching filter capable of improving the isolation characteristics while suppressing degradation of the attenuation characteristics and provides a communication module component using the same.

CITATIONS LIST

Patent Literature

Patent Literature 1: Japanese Patent Publication No. 5-183380A

SUMMARY OF INVENTION

A branching filter according to one aspect of the present invention has a group of terminals including an antenna terminal, a first terminal, a second terminal, and a ground terminal; a first filter which is located between the antenna terminal and the first terminal and which has resonator connection lines and a serial resonator and a parallel resonator connected through the resonator connection lines in a ladder type; a second filter which is located between the antenna terminal and the second terminal and which has a pass frequency band different from the pass frequency band of the first filter; a first connection line connecting the parallel resonator and the ground terminal; a second connection line connecting the second filter and the ground terminal; and a third connection line which connects the first connection line and the second connection line and which is electromagnetically coupled with at least one of the resonator connection lines, the serial resonator, and the parallel resonator.

Further, a communication module component according to one aspect of the present invention has a module board and the above-mentioned branching filter.

According to the above configurations, the isolation characteristics can be improved while suppressing degradation of the attenuation characteristics of the branching filter.

DESCRIPTION OF EMBODIMENTS

Figure 1:
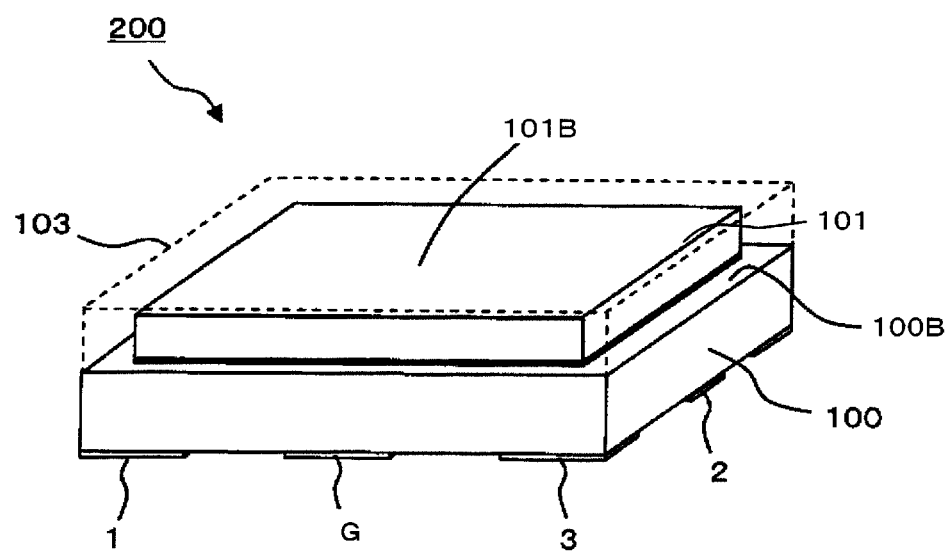
FIG. 1 A perspective view of an appearance of a branching filter according to an embodiment of the present invention.

Below, an embodiment of a branching filter according to the present invention is explained in detail with reference to the drawings. Note that, in the drawings which is explained below, the same portions are assigned the same notations. Further, the sizes of the patterns, the distance between the patterns, or the number, diameters and shapes of vias, etc. are schematically shown for explanation, therefore the present invention is not limited to them.

Branching Filter

A perspective view of a branching filter 200 according to the embodiment of the present invention is given in FIG. 1. The branching filter 200 which is shown in FIG. 1 is mainly configured by a circuit board 100 which is formed by stacking a plurality of dielectric layers and by a piezoelectric substrate 101 which is mounted on the circuit board 100. The piezoelectric substrate 101 is mounted on a second major surface 100B of the circuit board 100. Further, on the surface of the piezoelectric substrate 101 (third major surface 101A) which faces the second major surface 100B of the circuit board 100, a transmitting filter 5 as a first filter and a receiving filter 6 as a second filter are formed.

The piezoelectric substrate 101 is set to one size smaller than the circuit board 100 and is protected by being covered overall by a sealing resin 103 (indicated by a dot line in the diagram). Note that, the thickness of the circuit board 100 is for example 350 μm to 400 μm, while the thickness of the piezoelectric substrate 101 is for example 230 μm to 280 μm.

Figure 2:
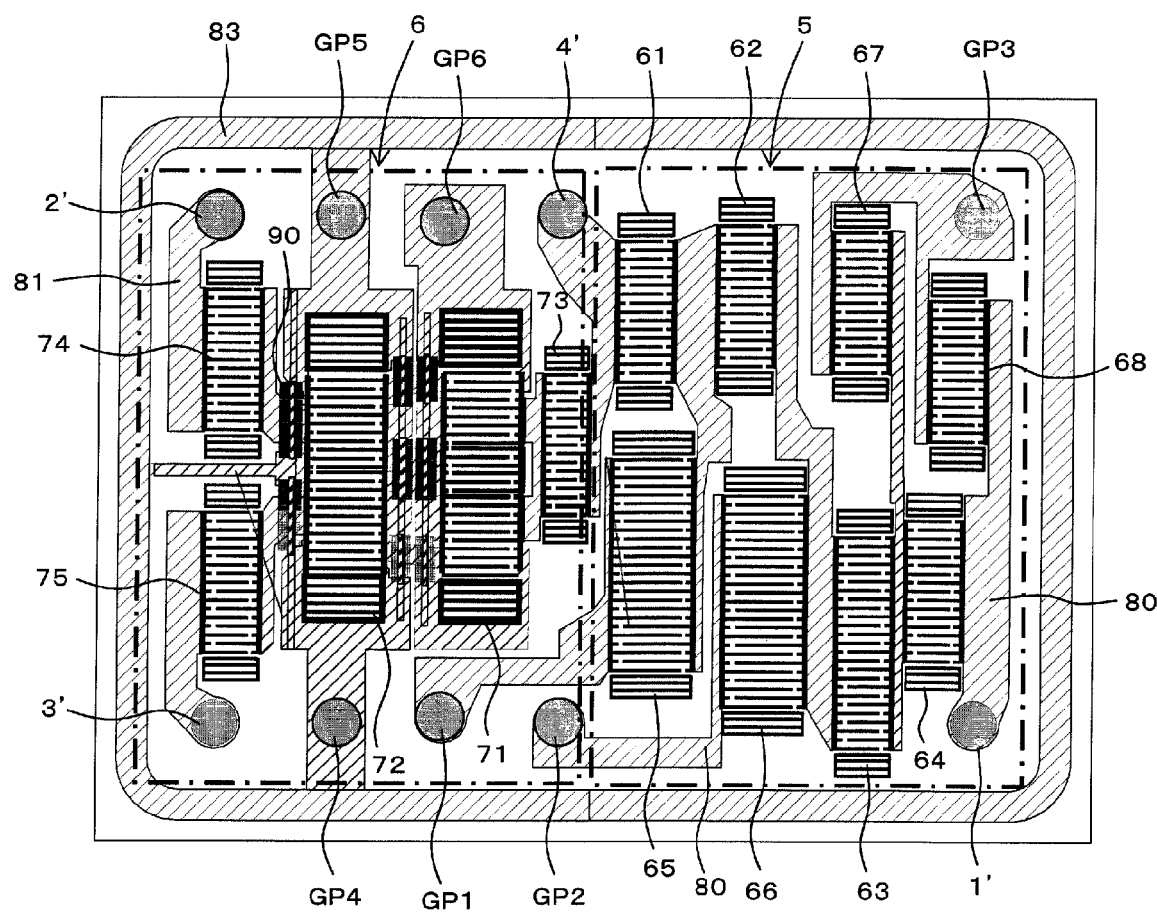
FIG. 2 A plan see-through view of a piezoelectric substrate which is used in the branching filter of the embodiment.

FIG. 2 is a plan see-through view when viewing the piezoelectric substrate 101 used in the branching filter according to the present embodiment from a fourth major surface 101B side on the opposite side to the third major surface 101A. The transmitting filter 5 and receiving filter 6 in the present embodiment are configured by surface acoustic wave filters. Note that, in the drawing, regions roughly corresponding to the transmitting filter 5 and the receiving filter 6 are indicated by one-dot chain lines.

In the transmitting filter 5, as shown in FIG. 2, a ladder type filter circuit is configured by serially connecting or parallel connecting a plurality of surface acoustic wave resonators. Specifically, in a route from an antenna-use pad 4' up to a transmission signal-use pad 1', serial resonators 61, 62, 63, and 64 are connected in series through a resonator connection line 80, while parallel resonators 65, 66, 67, and 68 are arranged between the resonator connection line 80 connecting the serial resonators 61, 62, 63, and 64 to each other and the ground pads GP1, GP2, and GP3.

On the other hand, the receiving filter 9 configures a vertical multimode type filter circuit. It is a surface acoustic wave filter provided with two double mode type surface acoustic wave elements 71 and 72 and three surface acoustic wave resonators 73, 74, and 75 as shown in FIG. 2. In the receiving filter 6, for example, a line 81 which connects the surface acoustic wave element 72 and the surface acoustic wave resonator 74 and a line 81 which connects the surface acoustic wave element 72 and the ground pad GP5 cross three-dimensionally by inserting an insulator 90 between the two lines. Among the other portions, a portion where lines having different potentials cross each other forms a three-dimensional intersection with the insulator 90 therebetween.

At the third major surface 101A of the piezoelectric substrate 101, a first ring-shaped line 83 is formed so as to surround the transmitting filter 5 and receiving filter 6. This first ring-shaped line 83 is joined to a second ring-shaped line 19 provided on the second major surface 100B of the circuit board 100 with joining material therebetween such as solder. Due to this, the transmitting filter 5 and receiving filter 6 are air-tightly sealed in a space surrounded by the joined first ring-shaped line 83 and second ring-shaped line 19, the second major surface 100B of the circuit board 100, and the third major surface 101A of the piezoelectric substrate 101.

Note that, the transmission signal-use pad 1' is electrically connected to the transmission signal terminal 1 of the circuit board 100, the reception signal-use pads 2' and 3' are electrically connected to the reception signal terminals 2 and 3 of the circuit board 100, and the antenna-use pad 4' is electrically connected to the antenna terminal 4 of the circuit board 100.

The transmitting filter 5 and the receiving filter 6 may be prepared on the same piezoelectric substrate or may be prepared on individual piezoelectric substrates.

In the present embodiment, the transmitting filter 5 and receiving filter 6 are arranged on the same piezoelectric substrate as shown in FIG. 2. In the manufacture of the branching filter, manufacturing variations sometimes arise in the transmitting filter 5 and the receiving filter 6. When these filters are fabricated on separate substrates, the result is that a transmitting filter and receiving filter having manufacturing variations are combined. Therefore, there is the possibility that the optimum inductance value of the signal line pattern of the matching circuit differs according to the combination. As opposed to this, when two filters are fabricated on the same piezoelectric substrate, they are filters fabricated at almost the same place of the wafer. Therefore, when viewing a transmission side filter and a reception side filter on the same substrate, any substrate cut from the wafer has almost the same optimal inductance value, variations resulting from the combination can be made smaller.

Figure 3:
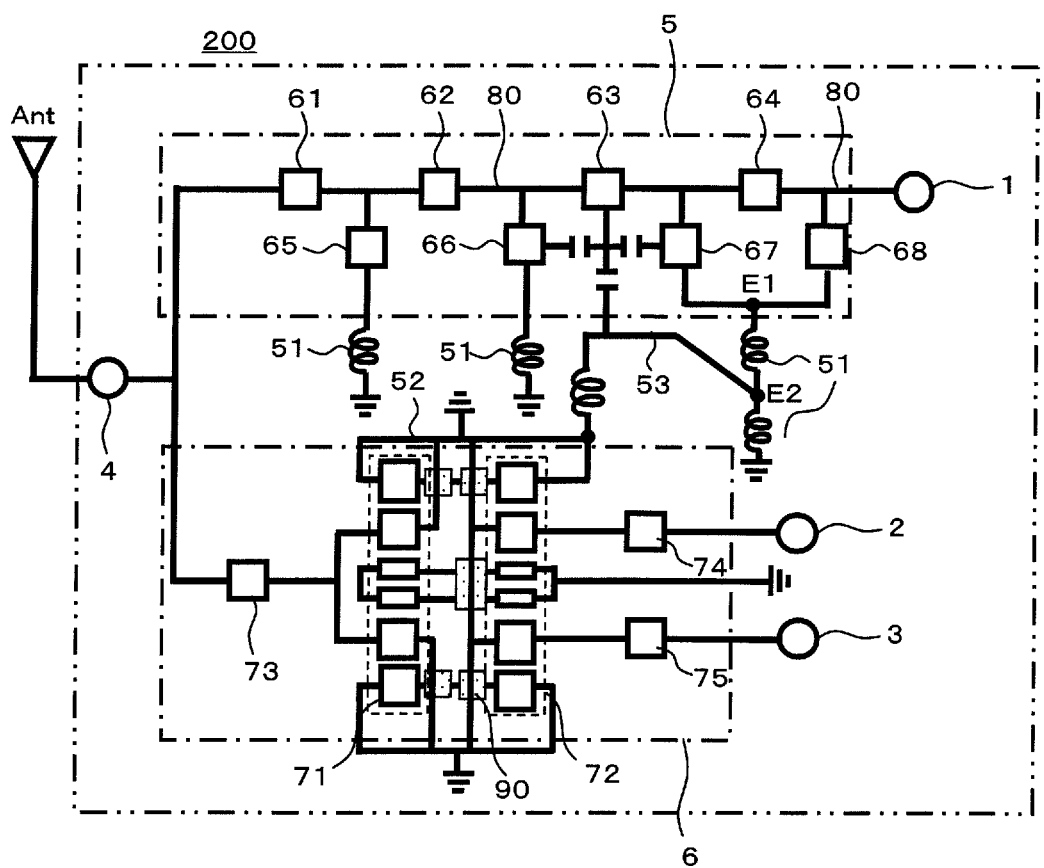
FIG. 3 A diagram of an equivalent circuit of the branching filter of the embodiment.

According to the configuration shown in FIG. 2, a transmitting filter 5 and receiving filter 6 shown in the equivalent circuit diagram in FIG. 3 are formed. The transmitting filter 5 is arranged between the antenna terminal 4 and the transmission signal terminal 1, while the receiving filter 6 is arranged between the antenna terminal 4 and the reception signal terminals 2 and 3. The transmitting filter 5 and the receiving filter 6 are set so that their pass band frequencies are different from each other. In the present embodiment, the frequencies are set so that the pass frequency band of the receiving filter 6 becomes higher than the pass frequency band of the transmitting filter 5. For example, the pass frequency band of the receiving filter 6 is 869 to 894 MHz, while the pass frequency band of the transmitting filter 5 is 824 to 849 MHz.

Further, the transmitting filter 5 is a filter in which both of the input signal and output signal are unbalanced signals, while the receiving filter 6 is a filter in which the input signal is an unbalanced signal while the output signal is a balanced signal. That is, in FIG. 3, an unbalanced signal is input to the transmission signal terminal 1, while balanced signals are output from the reception signal terminals 2 and 3.

The parallel resonators 65 to 68 of the transmitting filter 5 are connected through the first connection lines 51 to the ground terminals. Each first connection line 51 has an inductance having a predetermined magnitude. By resonance of this inductance and the capacity of the parallel resonator at a predetermined frequency, an attenuation pole is formed out of the band. This thereby raises the out-of-band attenuation amount.

On the other hand, the surface acoustic wave elements 71 and 72 of the receiving filter 6 are connected through the second connection line 52 to the ground terminal.

The first connection line 51 and the second connection line 52 are connected by a third connection line 53. This third connection line 53 is electromagnetically coupled to at least one of the serial resonators 61 to 64 and parallel resonators 65 to 68 configuring the transmitting filter 5 and the resonator connection line 80 connecting these resonators to each other. FIG. 3 shows an aspect in which the third connection line 53 is capacity coupled with the serial resonator 63 and the parallel resonators 66 and 67. Note that, the electromagnetical field coupling is coupling including at least one of capacity coupling and inductive coupling.

In this way, by connecting the first connection line 51 and the second connection line 52 by the third connection line 53 and electromagnetically coupling the third connection line 53 with at least one of the serial resonators 61 to 64, parallel resonators 65 to 68, and the resonator connection line 80 connecting these resonators to each other, the isolation characteristics can be improved with almost no degradation of the insertion loss.

Further, in order to effectively utilize the inductance of the connection line 51, a connection portion of the connection line 51 and the third connection line 53 is positioned at a portion of the connection line 51 which is nearer one end E2 forming the connection portion with the ground terminal than the other end E1 forming the connection portion with the parallel resonators 67 and 68.

Next, the circuit board 100 is explained. FIG. 4 show dielectric layers configuring the circuit board 100.

The circuit board 100 used in the branching filter 200 according to the present embodiment is formed by stacking two dielectric layers. When defining the layer on the second major surface 100B side of the circuit board 100 as the first layer and defining the layer on the first major surface 100A side as the second layer, FIG. 4A corresponds to a plan view of the first layer, FIG. 4C corresponds to a plan view of the second layer, and FIG. 4D corresponds to a plane see-through view of the second layer. Further, FIG. 4B is a diagram showing positions of vias formed in the first layer for connecting the line patterns of the first layer and the line patterns of the second layer, while FIG. 4D is a diagram showing the positions of vias formed in the second layer for connecting the line patterns of the second layer and the terminals formed on the back surface of the second layer. Note that, the major surface of the first layer corresponds to the second major surface 100B of the circuit board, and the back surface of the second layer corresponds to the first major surface 100A of the circuit board.

Figure 4A:
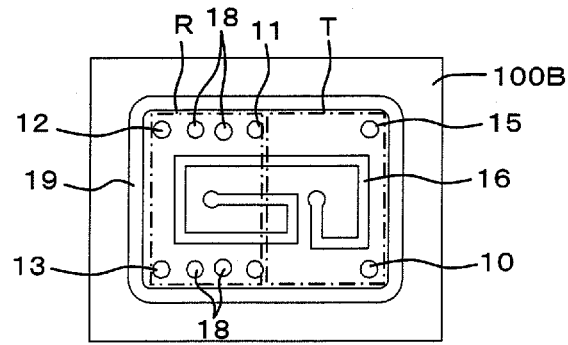
FIG. 4 Plan views of layers of a circuit board used in the branching filter of the embodiment.
Figure 4B:
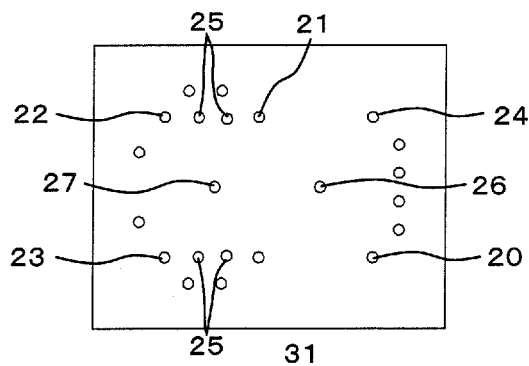
Figure 4C:
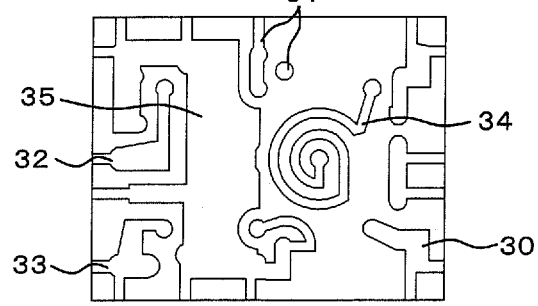
Figure 4D:
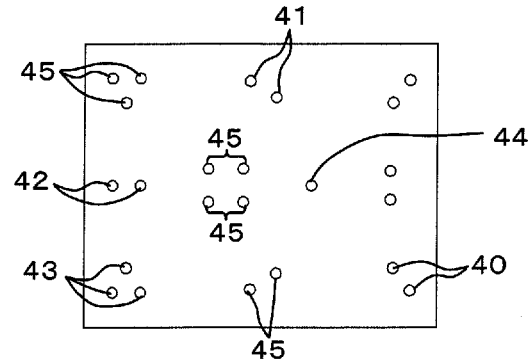

In FIG. 4A, a region T indicated by a one-dot chain line roughly corresponds to a region where the transmitting filter 5 is arranged in a facing manner, while a region R indicated by a one-dot chain line roughly corresponds to a region where the receiving filter 6 is arranged in a facing manner.

Figure 4E:
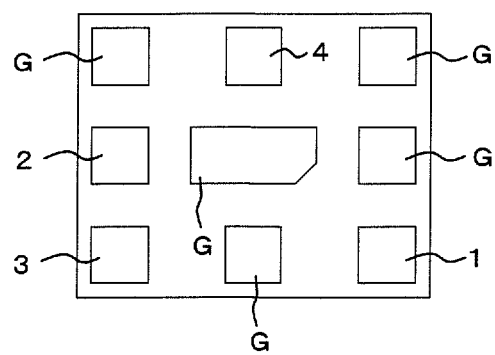

As shown in FIG. 4E, on the first major surface 100A of the circuit board, a group of terminals including the transmission signal terminal 1, reception signal terminals 2 and 3, antenna terminal 4, and a plurality of ground terminals G is formed. The group of these terminals and the transmitting filter 5 and receiving filter 6 are connected through line patterns and vias provided in the layers of the circuit board 100.

A transmission signal which is input from the transmission signal terminal 1 is input through an line pattern 30, via 20, and line pattern 10 to the transmitting filter 5. The transmission signal which is output from the transmitting filter 5 is output through an line pattern 11, via 21, line pattern 31, and via 41 from the antenna terminal 4.

The reception signal which is input from the antenna terminal 4 is input through the via 41, line pattern 31, via 21, and line pattern 11 to the receiving filter 6. The reception signal which is input to the receiving filter 6 is output through the line patterns 12 and 13, vias 22 and 23, line patterns 32 and 33, and vias 42 and 43 from the reception signal terminals 2 and 3.

The first connection lines 51 connecting the parallel resonators 67 and 68 of the transmitting filter 5 and the ground terminal G are configured by the line patterns 15 of the first layer, vias 24 in the first layer, line patterns 34 of the second layer, and vias 44 in the second layer. The line pattern 34 of the second layer is formed in a helical shape. An inductance having a predetermined magnitude is given to the first connection lines 51 by this.

The second connection line 52 connecting the receiving filter 6 and the ground terminal G is configured by an line pattern 18 of the first layer, a via 25 in the first layer, an line pattern 35 of the second layer, and a via 45 in the second layer.

The third connection line 53 connecting the first connection lines 51 and the second connection line 52 is configured by an line pattern 16 of the first layer and vias 26 and 27 in the first layer, the via 26 is connected to the line pattern 34 of the second layer which configures a portion of the first line patterns 51, and the via 27 is connected to the line pattern 35 of the second layer which configures a portion of the second connection line 52.

The line pattern 16 configuring a portion of the third connection line 53 is located on the second major surface 100B of the circuit board 100 and faces at least one of the serial resonators 61 to 64 and parallel resonators 65 to 68 configuring the transmitting filter 5 and the resonator connection line 80 connecting these resonators to each other. Due to this, the third connection line 53 and the resonators or the lines configuring the transmitting filter 5 can be electromagnetically coupled.

Line patterns and vias which are not assigned notations in FIG. 4 are all connected to the ground terminals G.

As the material of the dielectric configuring the circuit board 100, for example, use is made of a ceramic which contains alumina as a principal ingredient, a glass ceramic which can be sintered at a low temperature, or a glass epoxy resin containing an organic material as the principal ingredient or the like. When use is made of a ceramic or glass ceramic, the dielectric is fabricated by homogenously kneading a ceramic or other metal oxide with an organic binder by an organic solvent or the like and shaping the slurry formed by this into a sheet to thereby prepare a green sheet, forming the desired conductor patterns and vias, and then laminating and pressing these green sheets together, then sintering them.

The line patterns are fabricated on the surfaces of the dielectric layers by conductors, while the dielectric layers are connected by vias filled with the conductors. Here, as the conductor, use can be made of silver, an alloy formed by adding palladium to silver, tungsten, copper, gold, etc. These line patterns are fabricated by forming metal conductors by a combination of film forming method such as screen printing, vapor deposition or sputtering with etching. The patterns directly connected to the filter and the terminals connected when mounting the branching filter on an external circuit of a PCB etc. may be plated by Ni, Au, etc. if better connection with the connection terminals of the filter is required.

Next, results considering the third connection line 53 is explained by using FIG. 5 to FIG. 14.

Figure 5A:
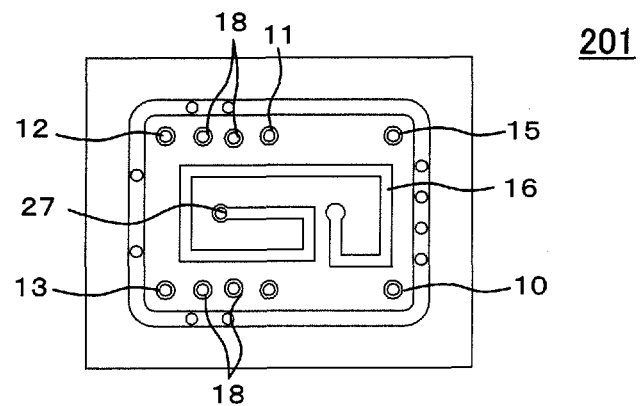
FIG. 5A to FIG. 5C are plan views of a first layer of the circuit board for explaining a mode of operation of the branching filter of the embodiment.
Figure 5B:
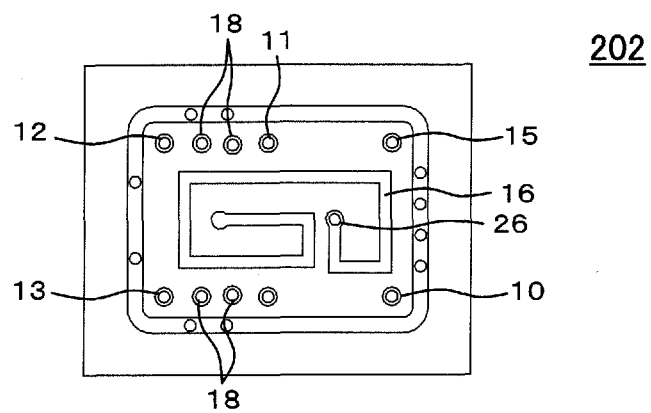
Figure 5C:
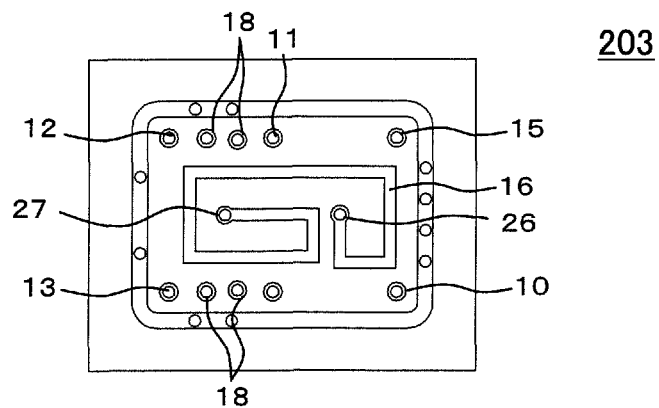
Figure 6:
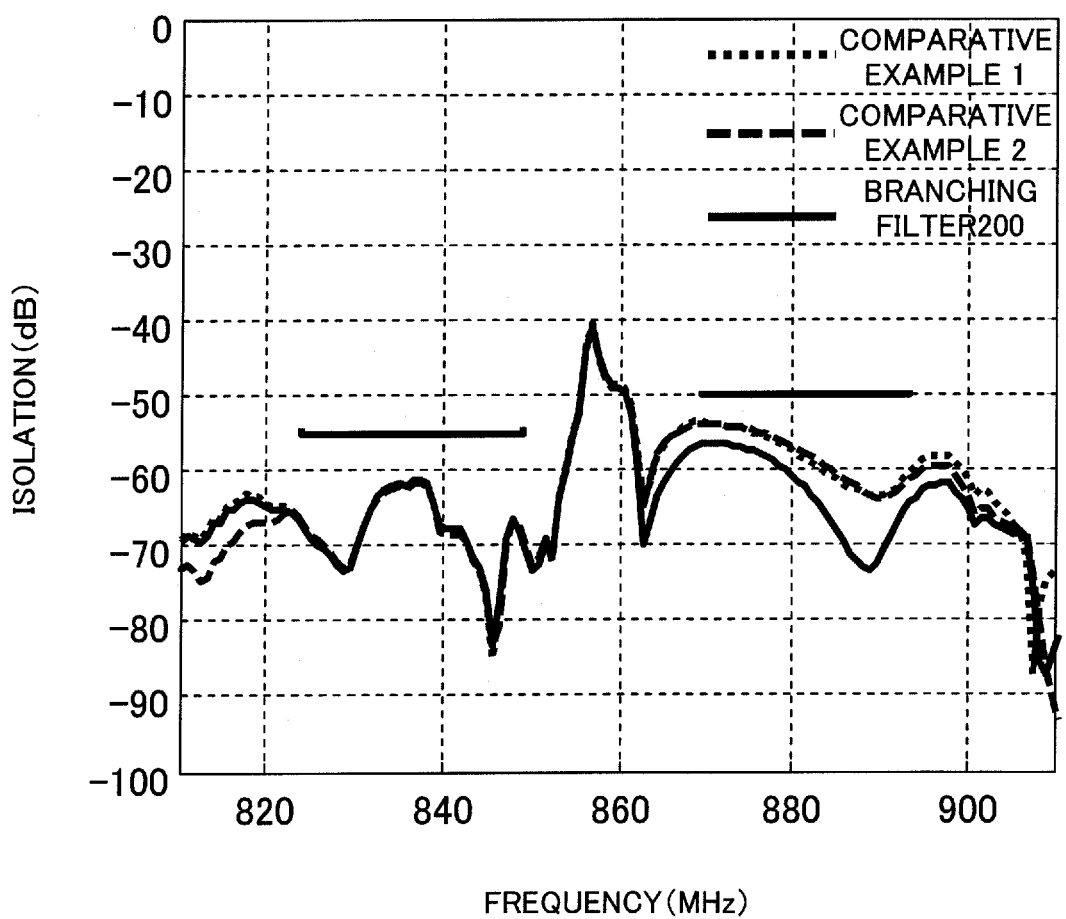
FIG. 6 A graph showing isolation characteristics of the branching filter which shown in FIG. 5.

First, the result obtained by checking the influence of the connection of the first connection lines 51 and the second connection line 52 exerted upon the characteristics is explained by using FIG. 5 and FIG. 6. FIGS. 5A to 5C are plan views of first layers of the circuit boards 100 used in the branching filters of Comparative Examples 1 and 2 and the branching filter 200 of the embodiment. They show the positions of vias of the first layers overlapping the line patterns of the first layers. Note that, all of the line patterns, vias, and groups of terminals of the second layers in FIGS. 5A to 5C are the same as those shown in FIG. 4.

FIG. 5A is a plan view of the first layer of the branching filter in Comparative Example 1 in which the third connection line 53 is connected to the second connection line 52, but is not connected to the first connection lines 51 and in which the via 26 to be connected to one end of the line pattern 16 which was provided in FIG. 4 is not provided. FIG. 5B is a plan view of the first layer of the branching filter in Comparative Example 2 in which the third connection line 53 is connected to the first connection lines 51, but is not connected to the second connection line 52 and in which the via 27 to be connected to the other end of the line pattern 16 which was provided in FIG. 4 is not provided. Accordingly, in the branching filters of the comparative examples in FIGS. 5A and 5B, the first connection lines 51 and the second connection line 52 are not connected.

On the other hand, FIG. 5C is a plan view of the first layer of the branching filter 200 shown in FIG. 4, in which the first connection lines 51 and the second connection line 52 are connected through the third connection line 53.

For these branching filters in Comparative Examples 1 and 2 and the branching filter 200 in the embodiment, the isolation characteristics were checked by simulation calculation. The results are shown in the graph in FIG. 6 and Table 1.

TABLE 1

|  | Comp. Ex. 1 | Comp. Ex. 2 | Branching filter 200 |
|---|---|---|---|
| Facing area of transmitting filter and line pattern 16 | 0.203 mm² | 0.203 mm² | 0.203 mm² |
| Attenuation pole frequency | 889.5 MHz | 890.5 MHz | 889.3 MHz |
| Rx band isolation Minimum value | 53.6 dB | 53.8 dB | 56.6 dB |
| Rx band isolation Maximum value | 63.4 dB | 63.7 dB | 73.5 dB |

In FIG. 6, an abscissa shows the frequency (MHz), and an ordinate shows the isolation (dB). As shown in FIG. 6 and Table 1, it is seen that the branching filter 200 in the embodiment is improved in the isolation characteristics in the reception band compared with the branching filters in Comparative Examples 1 and 2. It could be confirmed from this result that connection of the first connection lines 51 with the second connection line 52 was effective for improvement of the isolation characteristics of the branching filter.

Figure 7A:
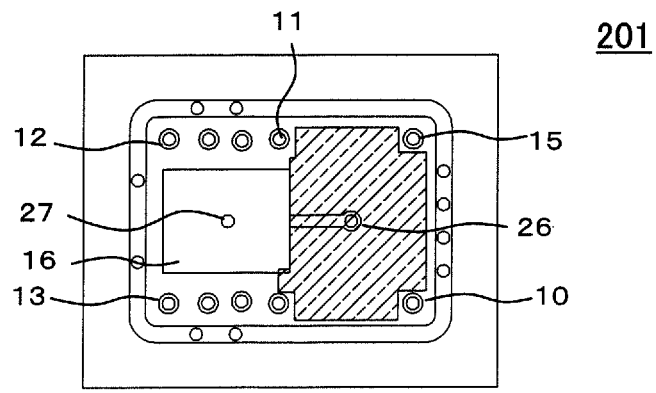
FIG. 7A to FIG. 7C are plan views of a first layer of the circuit board for explaining a mode of operation of the branching filter of the embodiment.
Figure 7B:
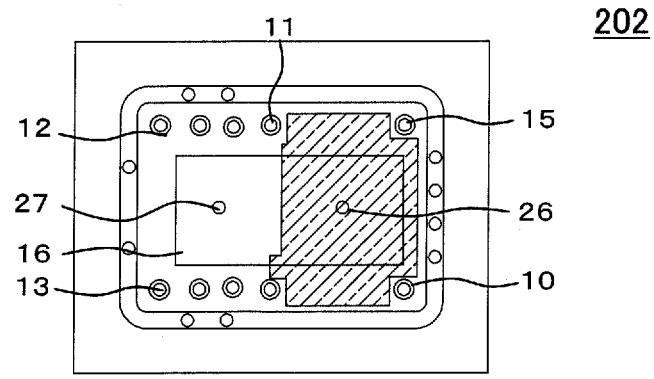
Figure 7C:
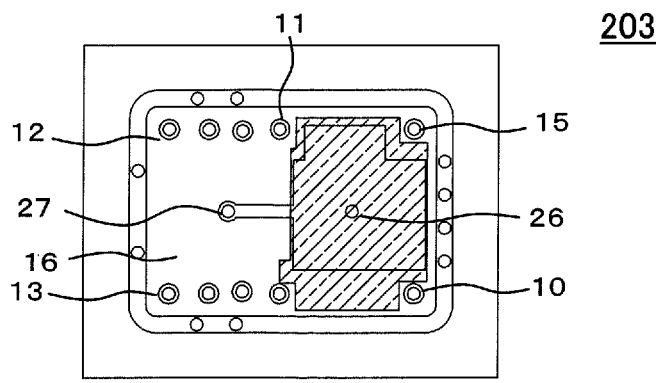
Figure 8:
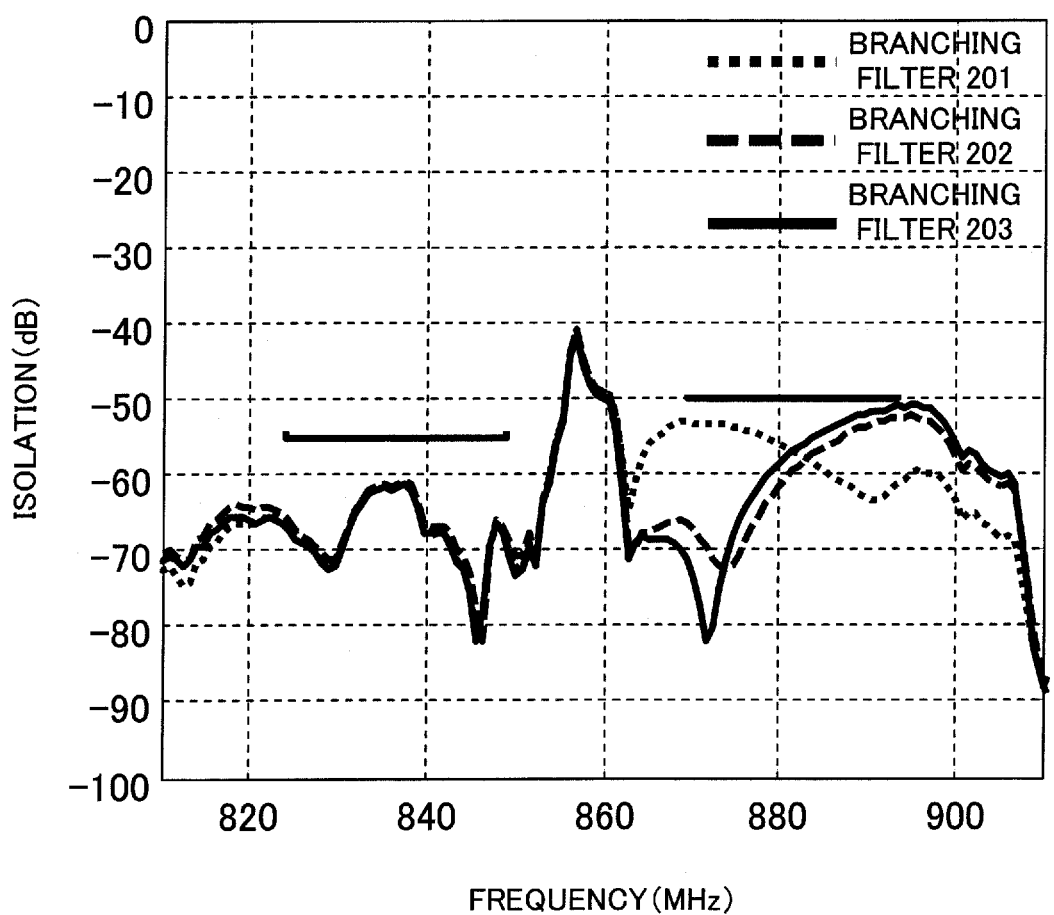
FIG. 8 A graph showing isolation characteristics of the branching filter which shown in FIG. 7.

Next, the result obtained by checking the influence of the electromagnetical coupling between the transmitting filter 5 and the third connection line 53 exerted upon the characteristics is explained by using FIG. 7 and FIG. 8.

FIG. 7 are a plan views of the first layers of the circuit boards 100 and show the positions of the vias overlapping the line patterns of the first layers. In each of the branching filters shown in FIGS. 7A to 7C, the shape of the line pattern 16 configuring the third connection line 53 is changed. Further, in FIGS. 7A to 7C, regions indicated by hatching are regions corresponding to the transmitting filters 5. Note that, all of the line patterns, vias, and groups of terminals of the second layers in FIGS. 7A to 7C are the same as those shown in FIG. 4.

FIG. 7A is a plan view of the first layer of a branching filter 201 in a case where a facing area of the line pattern 16 to the transmitting filter 5 is made smaller than the facing area of the line pattern 16 to the receiving filter 6. FIG. 7B is a plan view of the first layer of a branching filter 202 in a case where the facing area of the line pattern 16 to the transmitting filter 5 is made equal to the facing area of the line pattern 16 to the receiving filter 6. FIG. 7C is a plan view of the first layer of a branching filter 203 in a case where the facing area of the line pattern 16 to the transmitting filter 5 is made larger than the facing area of the line pattern 16 to the receiving filter 6.

For these branching filters 201 to 203, the isolation characteristics were checked by simulation calculation. The results are shown in the graph of FIG. 8 and Table 2.

TABLE 2

|  | Branching filter 202 | Branching filter 203 | Branching filter 201 |
|---|---|---|---|
| Facing area of transmitting filter and line pattern 16 | 0.489 mm² | 0.629 mm² | 0.034 mm² |
| Attenuation pole frequency | 874.0 MHz | 872.0 MHz | 891.2 MHz |
| Rx band isolation Minimum value | 52.5 dB | 51.1 dB | 53.1 dB |
| Rx band isolation Maximum value | 72.7 dB | 89.1 dB | 63.3 dB |

In FIG. 8, the abscissa shows the frequency (MHz), and the ordinate shows the isolation (dB). As shown in FIG. 8 and Table 2, it is seen that a large attenuation pole is not formed in the branching filter 201 having a small facing area of the line pattern 16 and the transmitting filter 5, but in contrast, in the branching filters 202 and 203 having large facing areas with respect to the transmitting filter 5, relatively large attenuation poles are formed in the reception band, and the isolation characteristics are improved.

It could be confirmed from this result that the electromagnetical coupling between the third connection line 53 and the transmitting filter 5 exerted a large influence upon the isolation characteristics of the branching filter.

Next, the results obtained by checking the influence of the magnitude of the electromagnetical coupling between the transmitting filter 5 and the third connection line 53 exerted upon the characteristics will be explained by using FIG. 9 and FIG. 10.

Figure 9A:
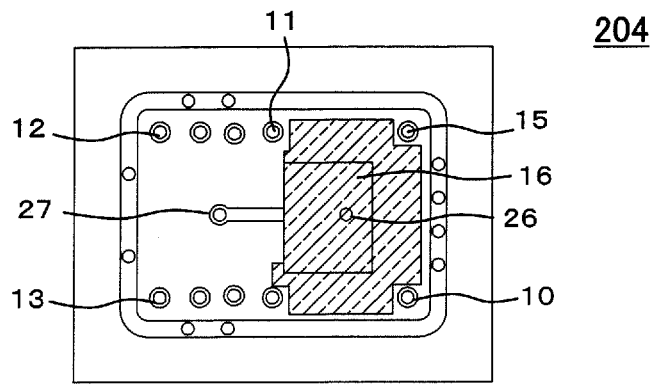
FIG. 9A to FIG. 9C are plan views of a first layer of the circuit board for explaining a mode of operation of the branching filter of the embodiment.
Figure 9B:
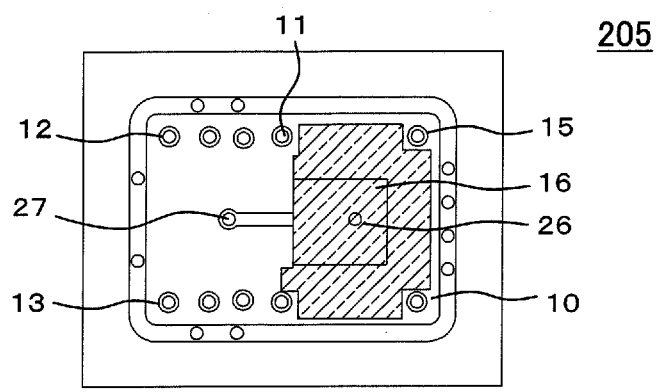
Figure 9C:
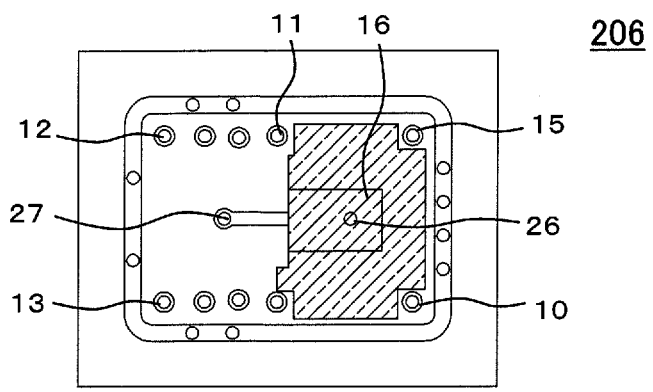

FIG. 9 are a plan views of the first layers of the circuit boards 100 and show the positions of the vias overlapping the line patterns of the first layers. In each of the branching filters shown in FIGS. 9A to 9C, the shape of the line pattern 16 configuring the third connection line 53 is changed. Further, in FIGS. 9A to 9C, regions indicated by hatching are regions corresponding to the transmitting filters 5. Note that, all of the line patterns, vias, and groups of terminals of the second layers in FIGS. 9A to 9C are the same as those shown in FIG. 4.

FIG. 9A shows a branching filter 204 in which the facing area of the line pattern 16 with respect to the transmitting filter 5 is made relatively large, FIG. 9B shows a branching filter 205 which makes the facing area of the line pattern 16 with respect to the transmitting filter 5 smaller than that of the branching filter 204, and FIG. 9C shows a branching filter 206 which makes the facing area of the line pattern 16 with respect to the transmitting filter 5 smaller than that of the branching filter 205. That is, the facing area of the line pattern 16 with respect to the transmitting filter 5 becomes smaller in an order of the branching filter 204, branching filter 205, and branching filter 206 in stages.

For these branching filters 204 to 206, the isolation characteristics were checked by simulation calculation. The results are shown in the graph of FIG. 10 and Table 3.

TABLE 3

|  | Branching filter 204 | Branching filter 205 | Branching filter 206 |
|---|---|---|---|
| Facing area of transmitting filter and line pattern 16 | 0.349 mm$^2$ | 0.286 mm$^2$ | 0.205 mm$^2$ |
| Attenuation pole frequency | 877.0 MHz | 879.2 MHz | 884.1 MHz |
| Rx band  Minimum value | 54.1 dB | 55.3 dB | 56.7 dB |
| isolation  Maximum value | 69.0 dB | 67.0 dB | 67.9 dB |

Figure 10:
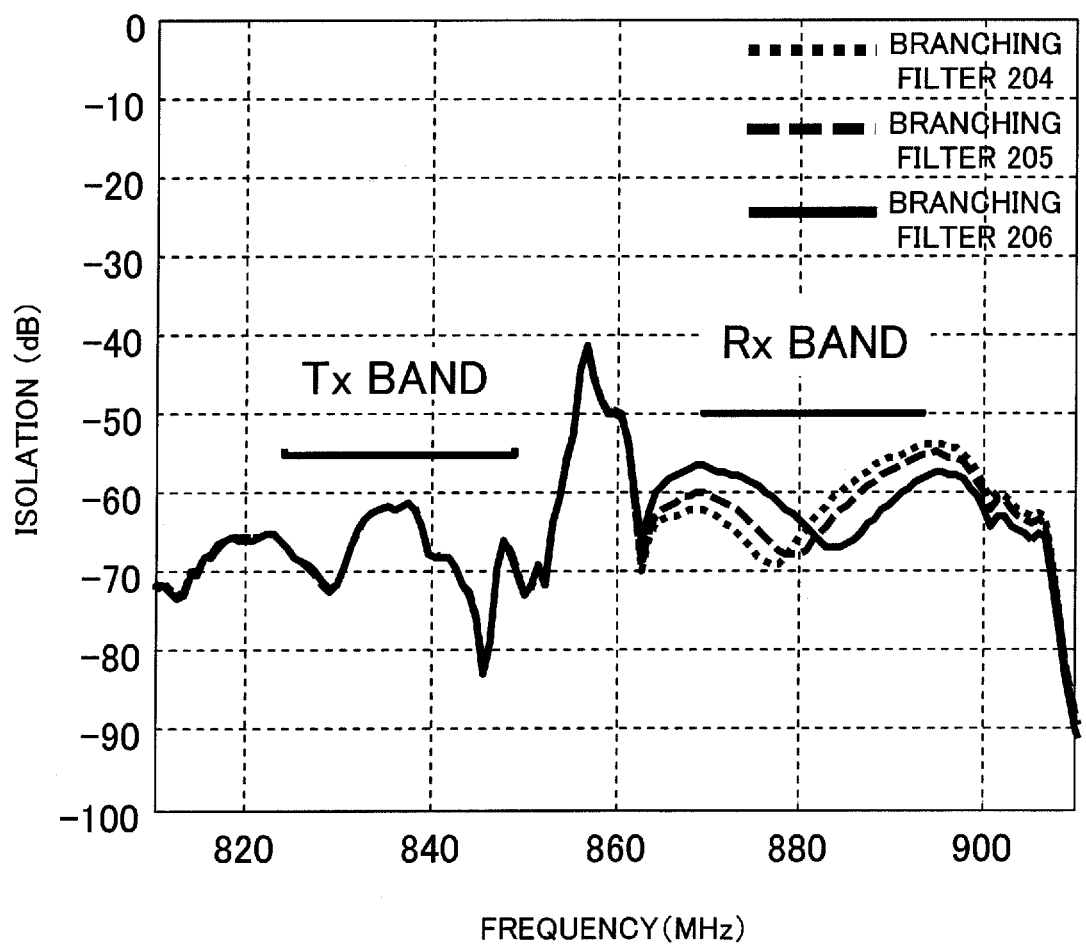
FIG. 10 A graph showing isolation characteristics of the branching filter which is shown in FIG. 9.

In FIG. 10, the abscissa shows the frequency (MHz), and the ordinate shows the isolation characteristics (dB). As shown in FIG. 10 and Table 3, it is learned that the larger the facing area of the line pattern 16 and the transmitting filter 5, the further the attenuation pole shifts to the low-pass side. It could be confirmed from this result that by changing the facing area of the line pattern 16 and the transmitting filter 5, that is, the magnitude of the electromagnetical coupling between the third connection line 53 and the transmitting filter 5, the position of the attenuation pole was controlled.

Figure 11A:
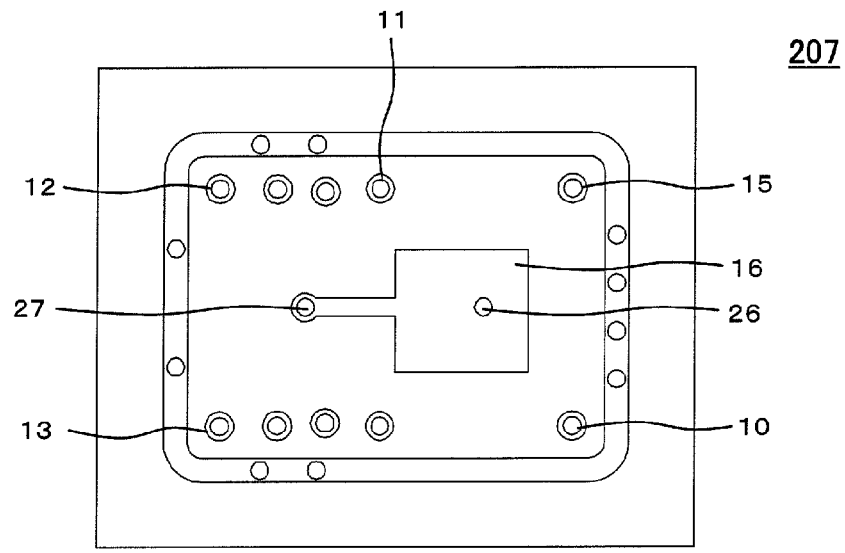
FIGS. 11A and 11B are plan views of a first layer of the circuit board for explaining a mode of operation of the branching filter of the embodiment.
Figure 11B:
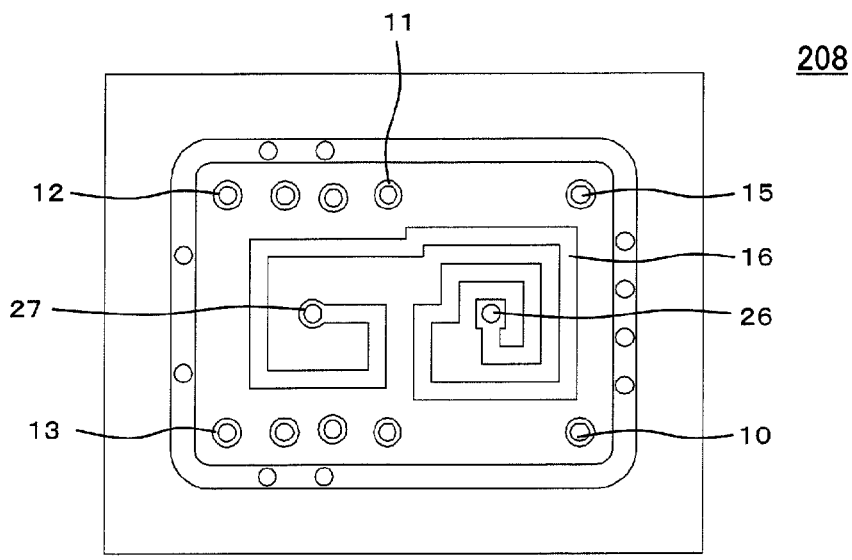
Figure 12:
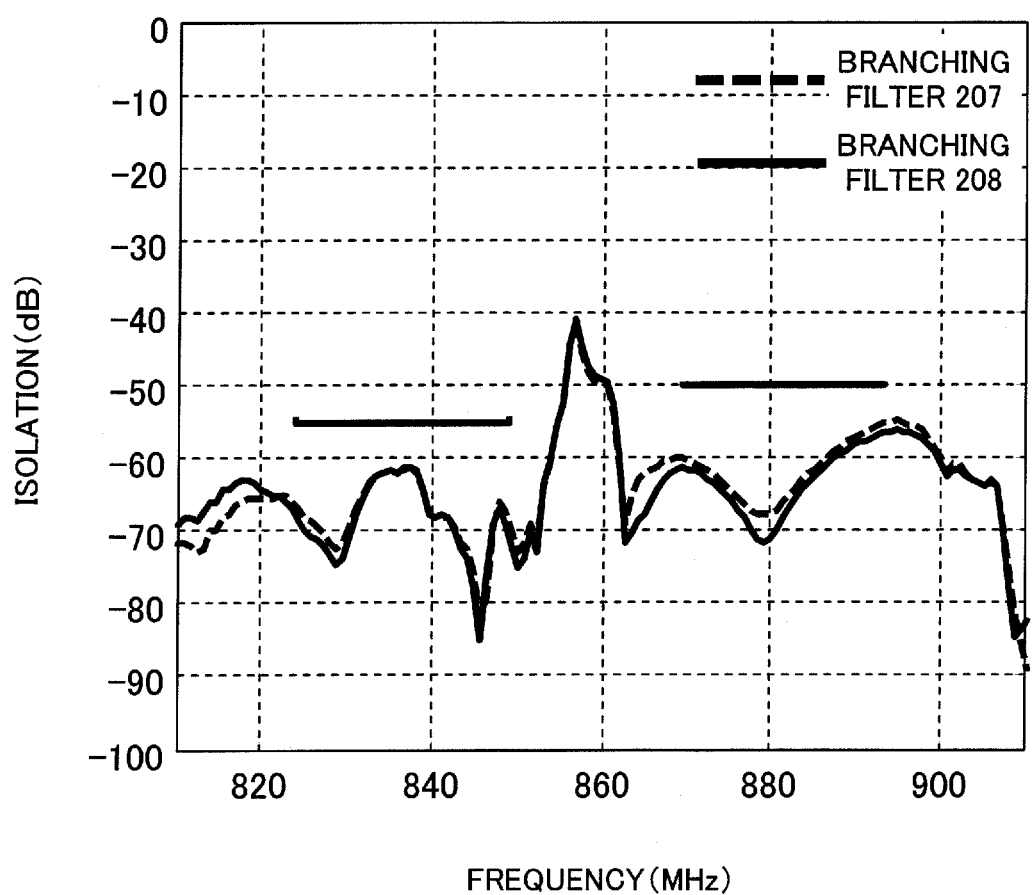
FIG. 12 A graph showing isolation characteristics of the branching filter which is shown in FIG. 11.

Next, the result obtained by checking the influence exerted upon the characteristics by the inductance of the third connection line 53 which is electromagnetically coupled with the transmitting filter 5 is explained by using FIG. 11 and FIG. 12.

FIG. 11 are plan views of the first layers of the circuit boards 100 and show the positions of the vias overlapping the line patterns of the first layers. Note, in each of the branching filters shown in FIGS. 11A and B, the shape of the line pattern 16 configuring the third connection line 53 is changed. Note that, all of the line patterns, vias, and groups of terminals of the second layers in FIGS. 11A and B are the same as those shown in FIG. 4.

FIGS. 11A and B show branching filters formed by making the inductances of the line patterns 16 different in a state where the facing areas of the line patterns 16 with respect to the transmitting filters 5 are made equal. FIG. 11A shows a branching filter 207 obtained by forming the portion of the line pattern 16 facing the transmitting filter 5 as a solid pattern and thereby make the inductance of the line pattern 16 small, while FIG. 11B shows a branching filter 208 obtained by forming the portion of the line pattern 16 facing the transmitting filter 5 in a helical shape and making the inductance of the line pattern 16 large.

For the branching filter 207 and branching filter 208, the isolation characteristics were checked by simulation. The results are shown in FIG. 12.

In FIG. 12, the abscissa shows the frequency (MHz), and the ordinate shows the isolation characteristics (dB). As shown in FIG. 12, it is seen that the branching filter 208 is improved in the isolation characteristics more than the branching filter 207. It could be confirmed from this result that the isolation characteristics were improved by making the inductance of the third connection line 53 which is electromagnetically coupled with the transmitting filter 5 large.

Figure 13A:
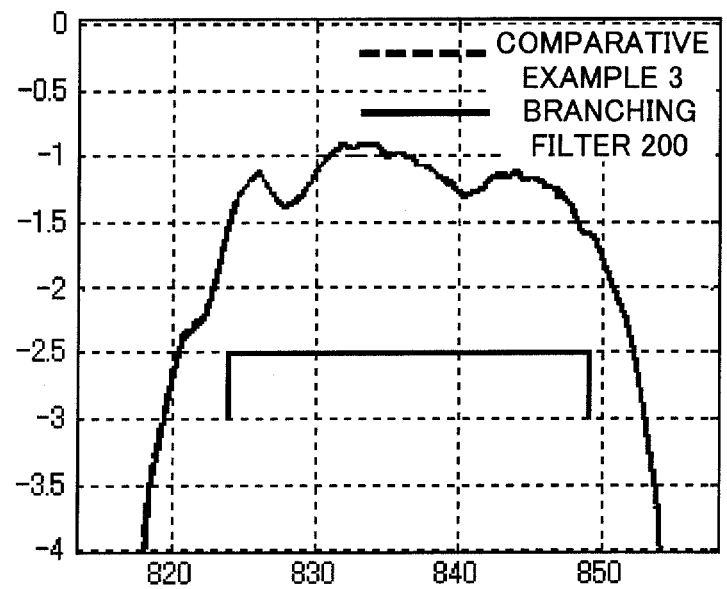
FIG. 13 Graphs showing insertion loss characteristics of a branching filter of a comparative example and the branching filter of the embodiment.
Figure 13B:
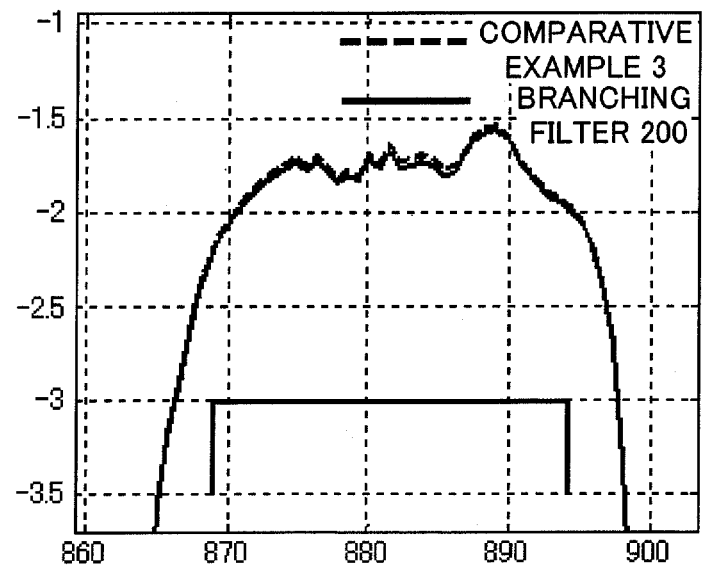
Figure 14:
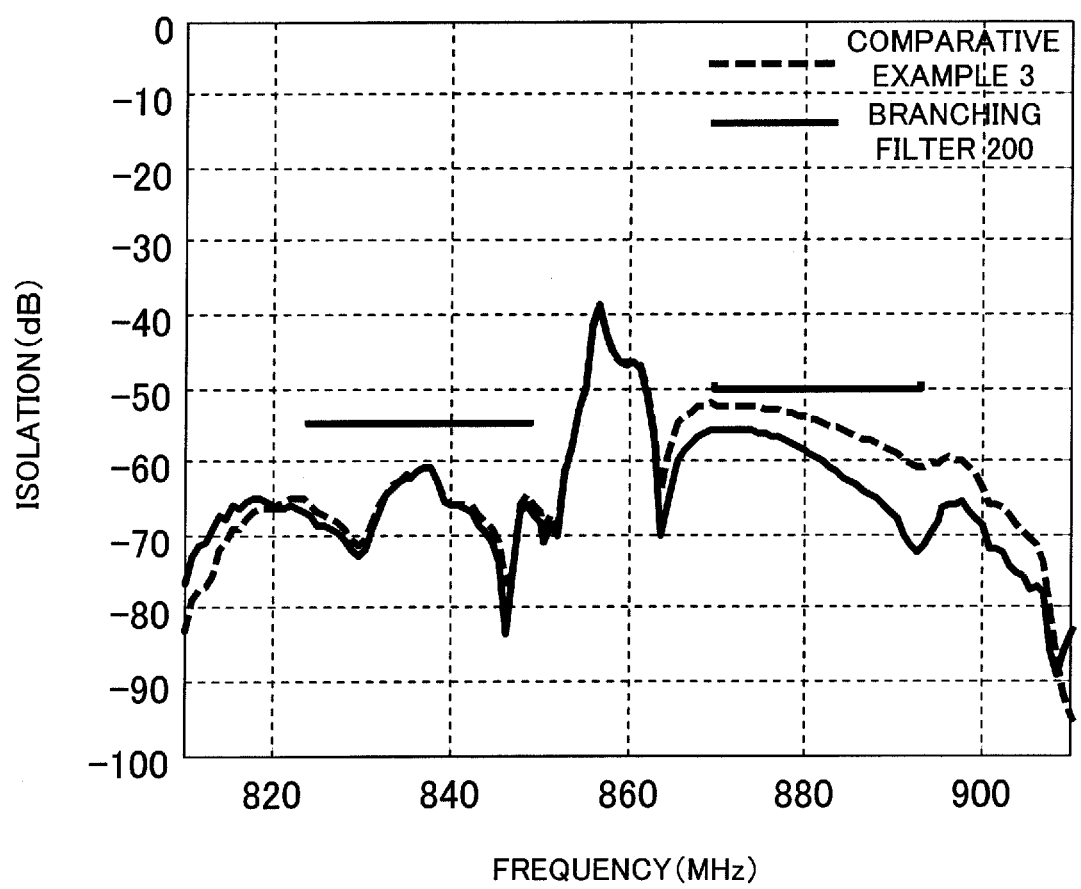
FIG. 14 A graph showing isolation characteristics of a branching filter of a comparative example and the branching filter of the embodiment.

Next, the result obtained by checking the influence exerted upon the insertion loss characteristic by the third connection line 53 which is electromagnetically coupled with the transmitting filter 5 is explained by using FIG. 13 and FIG. 14.

FIG. 13 are graphs showing the insertion loss characteristics of the branching filter 200 of the embodiment having the line pattern 16 shown in FIG. 4 and a branching filter in Comparative Example 3 obtained by eliminating only the line pattern 16 from the branching filter 200 of the embodiment. Note that, FIG. 13A shows the insertion loss in the transmission band, and FIG. 13B shows the insertion loss in the reception band.

As seen from FIG. 13, the branching filter 200 had almost no difference in the insertion loss characteristic from the branching filter in Comparative Example 3.

On the other hand, FIG. 14 is a graph showing the isolation characteristics of the branching filter 200 and the branching filter in Comparative Example 3. As seen from this graph, the branching filter 200 is improved in the isolation characteristics more than the branching filter in Comparative Example 3.

It could be confirmed from the results shown in FIG. 13 and FIG. 14 that the isolation characteristics were improved while suppressing degradation of the insertion loss characteristic by providing the third connection line 53.

It could be confirmed from the above consideration that the isolation characteristics of a branching filter could be improved while suppressing degradation of the insertion loss characteristic by connecting the first connection lines 51 and the second connection line 52 by the third connection line 53 and electromagnetically coupling the third connection line 53 with the transmitting filter 5.

Communication Module Component

Figure 15A:
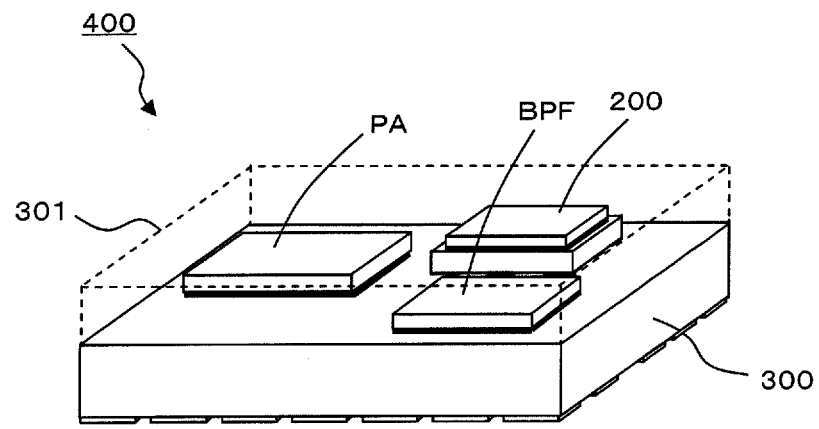
FIG. 15 Diagrams showing a communication module component according to the embodiment of the present invention, in which A is a perspective view of an appearance of the communication module component, and B is a block circuit diagram of the communication module component.
Figure 15B:
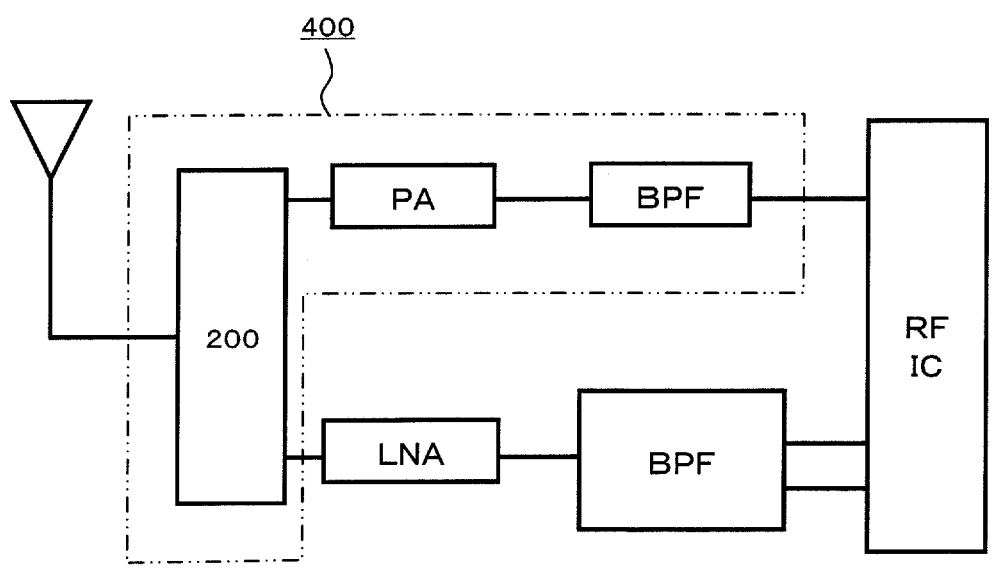

Next, an embodiment of a communication module component of the present invention is explained. FIG. 15 are perspective views of a communication module component 400 according to the present embodiment. The communication module component 400 includes, other than the branching filter 200, a power amplifier PA, band pass filter BPF etc. and is used as for example a transmission module of a mobile phone etc.

The communication module component 400 is obtained by mounting a branching filter 200, power amplifier PA, and band pass filter BPF on the upper surface of a module-use board 300 and then covering these parts by a resin 301. The communication module of the present embodiment is excellent in electrical characteristics by mounting of the branching filter 200 explained above. Note that, it is also possible to form the internal patterns of the circuit board 100 of the branching filter 200 inside the module-use board 300 and directly mount the piezoelectric substrate 101 on the module-use board 300.

Communication Apparatus

Figure 16:
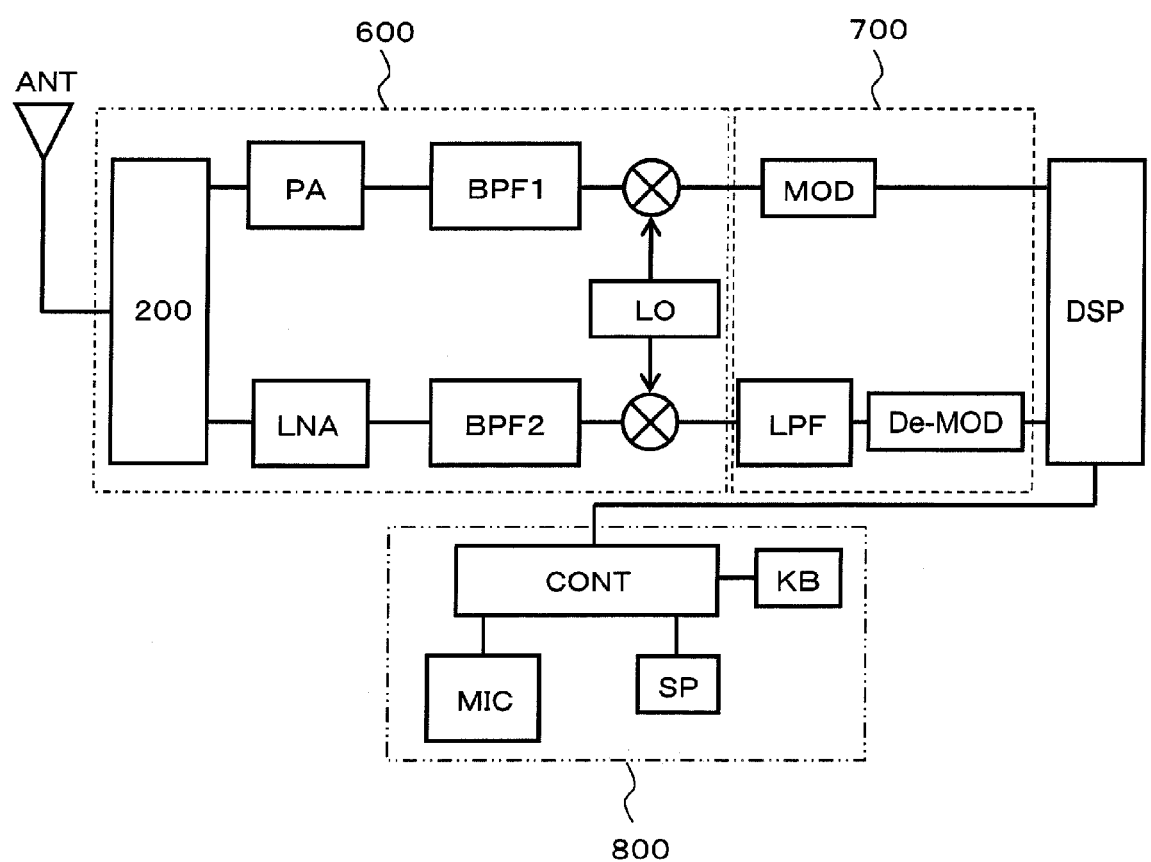
FIG. 16 A block circuit diagram of a communication apparatus using a branching filter according to the embodiment of the present invention

Next, an embodiment of a communication apparatus using the branching filter 200 explained above is explained. FIG. 16 is a block diagram of the communication apparatus according to the present embodiment. The communication apparatus shown in FIG. 16 is provided with an antenna ANT, an RF circuit 600 which is connected to the antenna ANT, an IF circuit 700 which is connected to the RF circuit 600, a signal processing circuit DSP which is connected to the IF circuit, and an interface part 800 which is connected to the signal processing circuit DSP.

The RF circuit 600 is provided with a branching filter 200, power amplifier PA, transmission-use band pass filter BPF1, low noise amplifier LNA, reception-use band pass filter BPF2, and local oscillator LO. The IF circuit 700 is provided with a modulator MOD, low pass filter LPS, and demodulator De-MOD. A user interface part 800 is provided with a control unit CONT, keyboard KB, microphone MIC, and speaker SP.

As shown in the same figure, an audio signal input from the microphone MIC is converted from an analog to digital format in a DSP (digital signal processor) and then modulated in the modulator MOD and further is converted in frequency by a mixer by using the oscillation signal of the local oscillator LO. The output of the mixer passes through the transmission-use band pass filter BPF1 and power amplifier PA and passes through the branching filter 200 and is output to the antenna ANT. The reception signal from the antenna ANT passes through the branching filter 200 and through the low noise amplifier LNA and reception-use band pass filter BPF2 and is input to the mixer. The mixer converts the frequency of the reception signal by using the oscillation signal of the local oscillator LO, then the converted signal passes through the low pass filter LPF and is demodulated in the demodulator De-MOD and is further converted from a digital to analog format in the DSP, thus an audio signal is output from the speaker. The communication apparatus shown in FIG. 10 is provided with the branching filter 200, therefore speech with little noise is possible.

Note that, in the above embodiment, the transmission signal terminal 1 is one example of the "first terminal", and the reception signal terminals 2 and 3 are one example of the "second terminal".

The present invention is not limited to the above embodiment and may be executed in a variety of ways.

A branching filter in which the transmitting filter 5 and receiving filter 6 were configured by surface acoustic wave filters was shown, but the configuration of the filter is not limited to this. The filter may be configured by a thin film acoustic resonator as well.

Further, a branching filter in which the pass frequency band of the transmitting filter 5 was lower than the pass frequency band of the receiving filter 6 was explained, but the present invention can also be applied to a branching filter in which the pass frequency band of the transmitting filter 5 is higher than the pass frequency band of the receiving filter 6.

SEQUENCE LISTING

1 . . . transmission signal terminal (first terminal)
2, 3 . . . reception signal terminals (second terminal)
4 . . . antenna terminal
5 . . . transmitting filter (first filter)
6 . . . receiving filter (second filter)
51 . . . first connection line
52 . . . second connection line
53 . . . third connection line
61 to 64 . . . serial resonators
65 to 68 . . . parallel resonators
80 . . . resonator connection line

The invention claimed is:

1. A branching filter, comprising:
a group of terminals comprising an antenna terminal, a first terminal, a second terminal, and a ground terminal;
a first filter which
is located between the antenna terminal and the first terminal,
has resonator connection lines and
has a serial resonator and a parallel resonator connected through the resonator connection lines in a ladder type;
a second filter which
is located between the antenna terminal and the second terminal and
has a pass frequency band different from a pass frequency band of the first filter;
a first connection line connecting the parallel resonator and the ground terminal;
a second connection line connecting the second filter and the ground terminal; and
a third connection line which connects the first connection line and the second connection line and overlapped with the first filter in a thickness direction, wherein the third connection line and at least one of the resonator connection lines, the serial resonator, and the parallel resonator are coupled electromagnetically.

2. The branching filter according to claim 1, wherein a connecting part connects the first connection line and the third connection line, is located at a portion in the first connection line, and which is nearer one end forming a connecting part with the ground terminal than the other end forming a connecting part with the parallel resonator.

3. The branching filter according to claim 1, wherein the pass frequency band of the second filter is higher than the pass frequency band of the first filter.

4. The branching filter according to claim 1, wherein an unbalanced signal is input into the first terminal, and a balanced signal is output from the second terminal.

5. The branching filter according to claim 1, wherein the first connection line comprises at least one of a portion formed in a helical shape and a portion formed in serpentine shape.

6. A communication module component, comprising:
a module board; and
the branching filter according to claim 1 which is mounted on the module board.

7. A branching filter, comprising:
a circuit board comprising:
a first major surface;
a second major surface on an opposite side to the first major surface; and
a piezoelectric substrate which is mounted on the second major surface comprising:
a third major surface facing the second major surface,
a first filter located on the third major surface, having resonator connection lines and having a serial resonator and a parallel resonator connected through the resonator connection lines in a ladder type, and
a second filter located on the third major surface, and having a pass frequency band different from a pass frequency band of the first filter, and
wherein the circuit board further comprises:
a group of terminals located on the a first major surface of the circuit board-and comprising an antenna terminal, a first terminal, a second terminal, and a ground terminal,
a first connection line connecting the parallel resonator and the ground terminal,
a second connection line connecting the second filter and the ground terminal, and
a third connection line located on the second major surface, connecting the first connection line and the second connection line, and having a portion facing at least one of the resonator connection lines, the serial resonator, and the parallel resonator.

8. The branching filter according to claim 7, wherein a connecting part connects the first connection line and the third connection line, is located at a portion in the first connection line, and which is nearer one end forming a connecting part with the ground terminal than the other end forming a connecting part with the parallel resonator.

9. The branching filter according to claim 7, wherein the third connection line comprises at least one of a portion formed in a helical shape and a portion formed in serpentine shape.

* * * * *